US010627617B2

United States Patent
Schatz et al.

(10) Patent No.: US 10,627,617 B2
(45) Date of Patent: Apr. 21, 2020

(54) MICROMECHANICAL CONSTITUENT AND METHOD FOR ADJUSTING AN ADJUSTABLE ELEMENT

(71) Applicant: Robert Bosch GmbH, Stuttgart (DE)

(72) Inventors: Frank Schatz, Kornwestheim (DE); Joerg Muchow, Reutlingen (DE); Mirko Hattass, Stuttgart (DE); Stefan Pinter, Reutlingen (DE); Thorsten Balslink, Kirchentellinsfurt (DE)

(73) Assignee: Robert Bosch GmbH, Stuttgart (DE)

( * ) Notice: Subject to any disclaimer, the term of this patent is extended or adjusted under 35 U.S.C. 154(b) by 64 days.

(21) Appl. No.: 15/770,085

(22) PCT Filed: Oct. 19, 2016

(86) PCT No.: PCT/EP2016/075008
§ 371 (c)(1),
(2) Date: Apr. 20, 2018

(87) PCT Pub. No.: WO2017/080762
PCT Pub. Date: May 18, 2017

(65) Prior Publication Data
US 2018/0314056 A1 Nov. 1, 2018

(30) Foreign Application Priority Data
Nov. 12, 2015 (DE) .................. 10 2015 222 305

(51) Int. Cl.
G02B 26/08 (2006.01)
G02B 26/10 (2006.01)
B81B 3/00 (2006.01)

(52) U.S. Cl.
CPC .......... *G02B 26/085* (2013.01); *B81B 3/0056* (2013.01); *G02B 26/0841* (2013.01);
(Continued)

(58) Field of Classification Search
CPC .................. G02B 26/085; G02B 26/0841; G02B 26/101; B81B 3/0056; B81B 2203/058; B81B 2201/042
(Continued)

(56) References Cited

U.S. PATENT DOCUMENTS

| 6,999,215 B2 * | 2/2006 | Dewa ................... G02B 26/085 |
| | | 310/311 |
| 8,508,098 B2 | 8/2013 | Lubianiker |

(Continued)

FOREIGN PATENT DOCUMENTS

| CN | 1532582 A | 9/2004 |
| JP | 2007322506 A | 12/2007 |

(Continued)

OTHER PUBLICATIONS

International Search Report dated Dec. 16, 2016 of the corresponding International Application PCT/EP2016/075008 filed Oct. 19, 2016.

*Primary Examiner* — Euncha P Cherry
(74) *Attorney, Agent, or Firm* — Norton Rose Fulbright US LLP; Gerard Messina (57) ABSTRACT

A micromechanical constituent includes an actuator designed to impart to a displaceable element a first displacement motion around a first rotation axis and a second displacement motion around a second rotation axis oriented tiltedly with respect to the first rotation axis, the actuator including a permanent magnet on a first spring element and a one second permanent magnet on a second spring element, where the first permanent magnet is excitable to perform a first translational motion tiltedly with respect to the first rotation axis and tiltedly with respect to the second rotation axis, and the second permanent magnet is excitable to perform a second translational motion directed oppositely to (Continued)

the first translational motion, causing the second displacement motion of the displaceable element around the second rotation axis.

11 Claims, 4 Drawing Sheets

(52) U.S. Cl.
CPC ...... *G02B 26/101* (2013.01); *B81B 2201/042* (2013.01); *B81B 2203/058* (2013.01)

(58) Field of Classification Search
USPC ...................................................... 359/199.3
See application file for complete search history.

(56) References Cited

U.S. PATENT DOCUMENTS

| | | |
|---|---|---|
| 2003/0210323 A1 | 11/2003 | Turner |
| 2004/0007069 A1 | 1/2004 | Turner et al. |
| 2004/0130766 A1 | 7/2004 | Dewa et al. |
| 2005/0078345 A1 | 4/2005 | Turner et al. |
| 2015/0260847 A1 | 9/2015 | Sromin et al. |

FOREIGN PATENT DOCUMENTS

| | | |
|---|---|---|
| JP | 2009020367 A | 1/2009 |
| JP | 2010107666 A | 5/2010 |
| JP | 2013190724 A | 9/2013 |
| JP | 2016033593 A | 3/2016 |
| WO | 2012070610 A1 | 5/2012 |

* cited by examiner

MICROMECHANICAL CONSTITUENT AND METHOD FOR ADJUSTING AN ADJUSTABLE ELEMENT

CROSS-REFERENCE TO RELATED APPLICATIONS

The present application is the national stage of International Pat. App. No. PCT/EP2016/075008 filed Oct. 19, 2016, and claims priority under 35 U.S.C. § 119 to DE 10 2015 222 305.1, filed in the Federal Republic of Germany on Nov. 12, 2015, the content of each of which are incorporated herein by reference in their entireties.

FIELD OF THE INVENTION

The present invention relates to a micromechanical constituent. The invention also relates to a method for displacing a displaceable element.

BACKGROUND

U.S. Pat. No. 8,508,098 describes a micromirror apparatus whose mirror element is said to be displaceable, with reference to a mount, in quasi-steady-state fashion around a first rotation axis and resonantly around a second rotation axis. For displacement of the mirror element around the first rotation axis by torsion of two outer torsional springs extending along the first rotation axis, the micromirror arrangement encompasses an electromagnetic actuator having stationary electromagnets, and further magnets attached to the two outer torsional springs. To produce the resonant displacement of the mirror element around the second rotation axis by torsion of two inner torsional springs extending along the second rotation axis, the micromirror apparatus also encompasses an electrostatic actuator having several electrode combs.

SUMMARY

The present invention creates capabilities for displacing a displaceable element, for example a micromirror, around two mutually inclined rotation axes, without and electrostatic actuator device being required in order to produce the two displacement motions around the rotation axes. Instead, the displacement motions around both rotation axes can be produced (for example, only) by way of magnetic interactions. Drive combs, which are often required for an electrostatic actuator of a conventional micromirror apparatus, thus become superfluous.

A displaceable element having no drive combs can therefore be used to implement the present invention, so that neither undesired damping due to drive combs, nor an increased moment of inertia due to the drive combs, needs to be overcome in order to displace the displaceable element. The present invention therefore creates capabilities for displacing the displaceable element with comparatively large deflections and with good effectiveness. In addition, the present invention eliminates the need to configure wiring for electrical contacting of drive combs. A number of mask planes used in the context of manufacture of the micromechanical constituent according to the present invention can thus also be considerably reduced.

The capabilities created by way of the present invention for omitting electrostatic excitation prevent flashovers that can occur during operation of an electrostatic actuator device as a result of the application of voltages (of approximately 150 volts). Such flashovers conventionally not only occur because of dust particles or moisture, but also can be brought about simply by ionization of air. In addition, material removal can occur during operation of an electrostatic actuator device with hard signal pulses. The disadvantages described here are, however, circumvented by the present invention.

Preferably the second displacement motion of the displaceable element is a harmonic oscillation of the displaceable element around the second rotation axis at a resonant frequency, such that as a result of the magnetic interaction with the magnetic field, the at least one first permanent magnet is excitable to perform the first translational motion at the resonant frequency, and the at least second permanent magnet is excitable to perform the second translational motion at the resonant frequency. Excitation of the translational motions of the permanent magnets thus triggers a resonant excitation of the displaceable element to oscillate harmonically, completely eliminating the use of an electrostatic actuator. Whereas conventionally, electrostatic production of a resonant excitation requires that relatively high voltages, e.g., voltages of at least 150 volts, must be applied to the micromechanical constituent and managed, the embodiment described here of the micromechanical constituent is operable without this complexity of a control system.

Preferably the first rotational motion of the at least one first permanent magnet around the first rotation axis is in phase with the second rotational motion of the at least one second permanent magnet around the first rotation axis. The desired first displacement motion of the displaceable element around the first rotation axis can thus be produced reliably by way of the in-phase rotational motions of the permanent magnets.

In an advantageous example embodiment of the micromechanical constituent, the magnetic field producible by way of the magnetic device has at the at least one first permanent magnet a magnetic field component oriented perpendicularly to the first rotation axis, and has at the at least one second permanent magnet the magnetic field component oriented perpendicularly to the first rotation axis. A magnetic field of this kind is advantageously suitable for producing the in-phase rotational motions of the permanent magnets.

In addition, the magnetic field producible by way of the magnetic device can have radial magnetic field components at the at least one first permanent magnet, and also radial magnetic field components at the at least one second permanent magnet. The radial magnetic field components are advantageously suitable for producing the oppositely directed translational motions of the permanent magnets. In particular, the magnetic device can be designed to modulate the magnetic field components oriented perpendicularly to the first rotation axis at at least one first frequency, and the radial magnetic field components at at least one second frequency not equal to the first frequency.

In a further advantageous embodiment, the at least one first permanent magnet has a first polarity oriented perpendicularly to the first rotation axis, and the at least one second permanent magnet has a second polarity directed oppositely to the first polarity. It is advantageous in this case if the magnetic field producible by way of the magnetic device has, both at the at least one first permanent magnet and at the at least one second permanent magnet, a field strength gradient oriented perpendicularly to the first rotation axis. It is possible in this manner as well to produce the desired oppositely directed translational motions of the permanent magnets in order to trigger the second displacement motion of the displaceable element around the second rotation axis.

The micromechanical constituent can encompass an intermediate frame component that is connected to the mount via the first spring element extending along the first rotation axis and via the second spring element extending along the first rotation axis. Preferably, the intermediate frame component is suspended on the mount between the first spring element and the second spring element. In this case the first displacement motion around the first rotation axis, with reference to the mount, is impartable to the intermediate frame component together with the displaceable element. In supplementary fashion, the micromechanical constituent can also encompass at least one third spring element by way of which the displaceable element is connected to the intermediate frame component in such a way that the second displacement motion around the second rotation axis, with reference to the intermediate frame component and the mount, is impartable to the displaceable element. Embodying the micromechanical constituent with the intermediate frame component thus has little or no negative effect on the resonant frequency of the displaceable element around the second rotation axis. The resonant frequency of the displaceable element around the second rotation axis can furthermore be adjusted by way of a corresponding embodiment of the at least one third spring element, independently of the spring characteristics of the first spring element and second spring element.

In an example embodiment, the micromechanical constituent is a micromirror apparatus having the displaceable element encompassing a micromirror. A micromechanical constituent of this kind is versatile, being usable, e.g., in a projector (laser projector) and in an (adaptive) headlight (laser headlight) for a vehicle/motor vehicle. It is noted, however, that a range of embodiments of the micromechanical constituent is not limited to a micromirror apparatus or to outfitting of the latter with a micromirror.

The advantages described above are also created upon implementation of the corresponding method for displacing a displaceable element. The method can be refined in accordance with the above-described embodiments of the micromechanical constituent.

Further features and advantages of the present invention will be explained below with reference to the Figures.

DETAILED DESCRIPTION

Figure 1A:
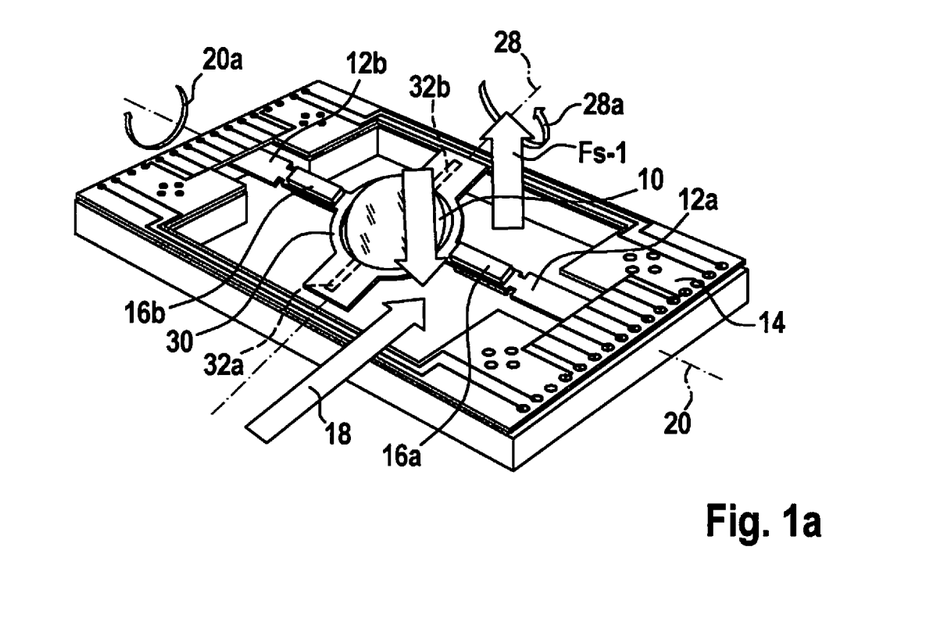
FIGS. 1a-1e are schematic depictions to explain a first example embodiment of the micromechanical constituent and its manner of operation.
Figure 1B:
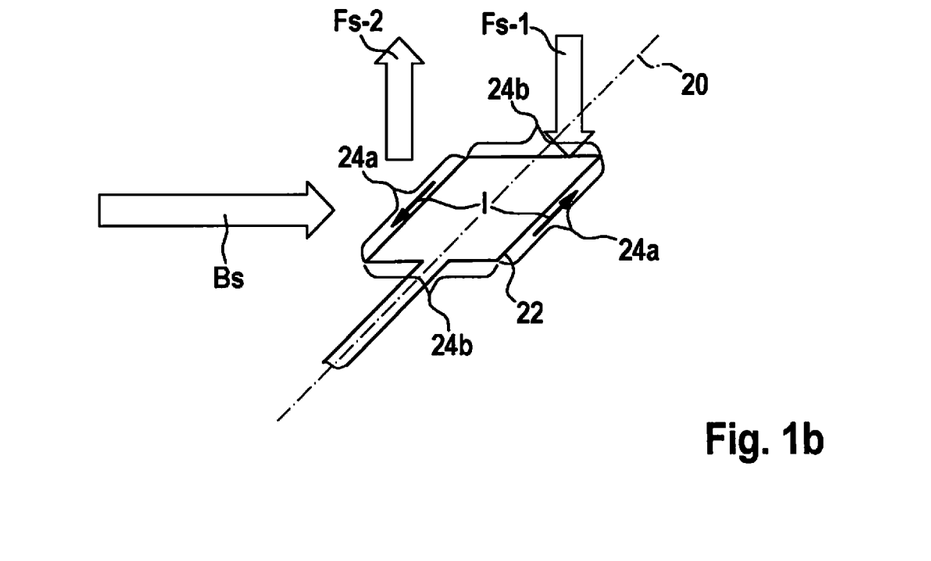
Figure 1C:
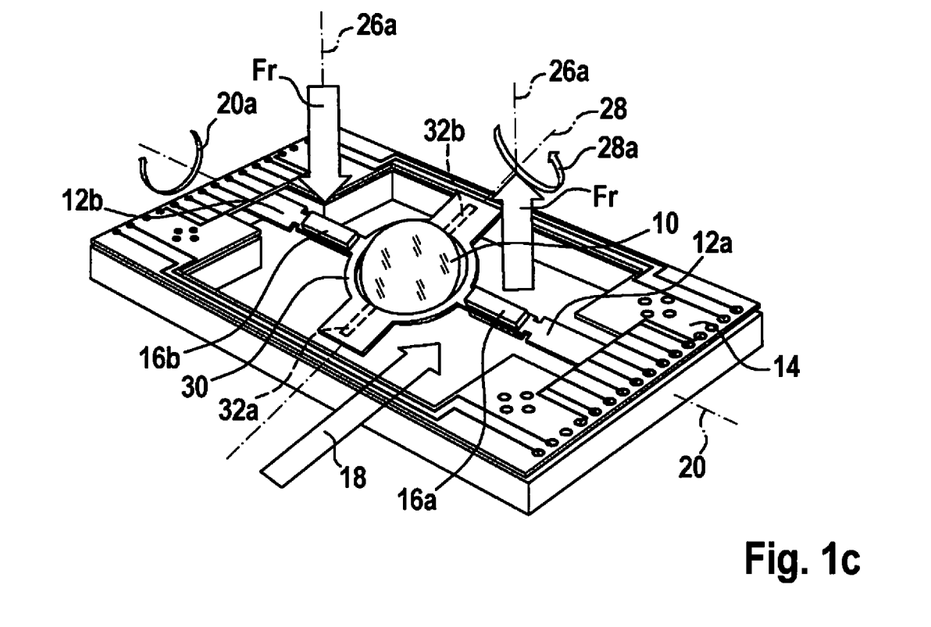

FIGS. 1a-1e are schematic depictions to explain a first embodiment of the micromechanical constituent and its manner of operation. The micromechanical constituent schematically depicted in FIGS. 1a and 1c is embodied, merely by way of example, as a micromirror apparatus having a micromirror 10 as at least part of its displaceable element 10.

A range of embodiment of the micromechanical constituent is not limited, however, to a displaceable element 10 of this kind.

The displaceable element or micromirror 10 is suspended, at least by way of a first spring element 12a and a second spring element 12b, on a mount 14 of the micromechanical constituent. The micromechanical constituent furthermore has at least one first permanent magnet 16a disposed or fastened on first spring element 12a, and at least one second permanent magnet 16b disposed or fastened on second spring element 12b. The micromechanical constituent furthermore has a magnetic device that is configured to produce a magnetic field 18 respectively at the at least one first permanent magnet 16a and at the at least one second permanent magnet 16b. A graphical depiction of the magnetic device is omitted in FIGS. 1a and 1c in the interest of better clarity. Possible examples of the magnetic device that is usable are nevertheless described below.

At least one magnetic field component Bs of magnetic field 18 is producible, at the at least one first permanent magnet 16a and at the at least one second permanent magnet 16b, in such a way that a first rotational motion around a first rotation axis 20 of displaceable element 10 is impartable or becomes imparted to the at least one first permanent magnet 16a (due to a magnetic interaction with magnetic field 18), and a second rotational motion around first rotation axis 20 is impartable or becomes imparted to the at least one second permanent magnet 16b (due to a magnetic interaction with magnetic field 18). The first rotational motion of the at least one first permanent magnet 16a, and the second rotational motion of the at least one second permanent magnet 16b, are graphically reproduced in FIG. 1a.

FIG. 1b graphically explains production of the rotational motions of permanent magnets 16a and 16b. The at least one first or second permanent magnet 16a or 16b is graphically reproduced in FIG. 1b as a magnetic dipole of a conductive loop 22 having sub-portions 24a oriented parallel to first rotation axis 20, sub-portions 24b oriented perpendicularly to first rotation axis 20, and a current intensity I flowing through conductive loop 22. A magnetic field component Bs oriented perpendicularly to first rotation axis 20 produces, on sub-portions 24a of conductive loop 22 which are oriented parallel to first rotation axis 20, oppositely directed forces Fs-1 and Fs-2 that act correspondingly on the halves, located on the two sides of first rotation axis 20, of the at least one first or second permanent magnet 16a or 16b.

A resulting torque M is obtained in accordance with equation (Eq. 1):

$$M = I * B * 1 * b \qquad \text{(Eq. 1)}$$

where l is a length of the at least one first or second permanent magnet 16a or 16b along first rotation axis 20, and b is a width of the at least one first or second permanent magnet 16a or 16b perpendicularly to first rotation axis 20. It is thereby possible to produce torques M sufficient for reliable rotation of permanent magnets 16a and 16b even with small permanent magnets 16a and 16b and with a magnetic field 18 having a magnetic field strength of at most 10 mT (millitesla).

As is evident from FIG. 1a, the oppositely directed forces Fs-1 and Fs-2 produce, on the two halves of the at least one first or second permanent magnet 16a or 16b, tilting thereof around first rotation axis 20 as the first or second rotational motion. The first rotational motion of the at least one first permanent magnet 16a and the second rotational motion of the at least one second permanent magnet 16b in turn trigger a first displacement motion 20a of first displaceable element 10 around first rotation axis 20 with reference to mount 14. Permanent magnets 16a and 16b and the magnetic device interacting therewith are thus suitable as an actuator device by way of which first displacement motion 20a around first rotation axis 20 with reference to mount 14 is impartable to displaceable element 10.

Preferably, by way of the magnetic device, the magnetic field component Bs oriented perpendicularly to first rotation axis 20 is producible with the same magnitude (constant over time or varying over time) at the at least one first permanent magnet 16a and at the at least one second permanent magnet 16b. In this case, the first rotational motion of the at least one first permanent magnet 16a around first rotation axis 20 and the second rotational motion of the at least one second permanent magnet 16b around first rotation axis 20 are in phase with each other. This can be understood to mean that that the rotational motions of permanent magnets 16a and 16b behave mirror-symmetrically with reference to an (optional) plane of symmetry (not depicted) of the micromechanical constituent. In particular, in-phase or mirror-symmetrical rotational motions of permanent magnets 16a and 16b produce a uniform displacement of displaceable element 10 around first rotation axis 20 with reference to mount 14. In particular, a quasi-steady-state displacement of displaceable element 10 around first rotation axis 20 with reference to mount 14 is thereby reliably producible.

Permanent magnets 16a and 16b are preferably disposed directly on spring elements 12a and 12b. This makes possible a "separation" of an inertia of displaceable element 10 from an inertia of permanent magnets 16a and 16b. The disposition of permanent magnets 16a and 16b separately from displaceable element 10 furthermore prevents undesired deformation or bulging of displaceable element 10 as a result of forces exerted on permanent magnets 16a and 16b.

Magnetic field 18 producible by way of the magnetic device also, however, excites the at least one first permanent magnet 16a (because of its magnetic interaction with magnetic field 18) to perform a first translational motion along a first translation axis 26a (see FIG. 1c). The magnetic field producible by way of the magnetic device furthermore excites the at least one second permanent magnet 16b (because of its magnetic interaction with magnetic field 18) to perform a second translational motion along a second translation axis 26b. First translation axis 26a and second translation axis 26b are (almost) parallel to one another. The translational motions of permanent magnets 16a and 16b are furthermore directed oppositely to each other. This can be understood to mean that during a translation of the at least one first permanent magnet 16a along first translation axis 26a in a first direction, the at least one second permanent magnet 16b would move along second translation axis 26b in a second direction or counter-direction directed oppositely to the first direction. Correspondingly, during a translation of the at least one first permanent magnet 16a along first translation axis 26a in the second direction, the at least one second permanent magnet 16b would move along second translation axis 26b in the first direction or counter-direction.

FIG. 1d again graphically reproduces the at least one first or second permanent magnet 16a or 16b as a magnetic dipole of conductive loop 22 having sub-portions 24a oriented parallel to first rotation axis 20, sub-portions 24b oriented perpendicularly to first rotation axis 20, and current strength I flowing through conductive loop 22. As depicted graphically in FIG. 1d, magnetic field components Br-1 to Br-4, which are directed from a center point of conductive loop 22 radially outward (or radially inward to the center point of conductive loop 22), produce a force Fr oriented perpendicularly to conductive loop 22. A direction of the force Fr oriented perpendicularly to conductive loop 22 depends on an orientation of the current strength I and of the radial magnetic field components Br-1 to Br-4. (The radial magnetic field components Br-1 to Br-4 are oriented radially with respect to the at least one first or second permanent magnet 16a or 16b, i.e., directed away from its center point or toward its center point. They can also be described as magnetic field components Br-1 to Br-4 oriented perpendicularly to surfaces of the at least one first or second permanent magnet 16a or 16b. The radial magnetic field components Br-1 to Br-4 of magnetic field 18 can be generated, for example, by way of a coil below the first or second permanent magnet 16a and 16b, a principal direction being oriented perpendicularly to first rotation axis 20 and perpendicularly to the "fountain" shape of radial magnetic field components Br-1 to Br-4 of magnetic field 18.)

Figure 1D:
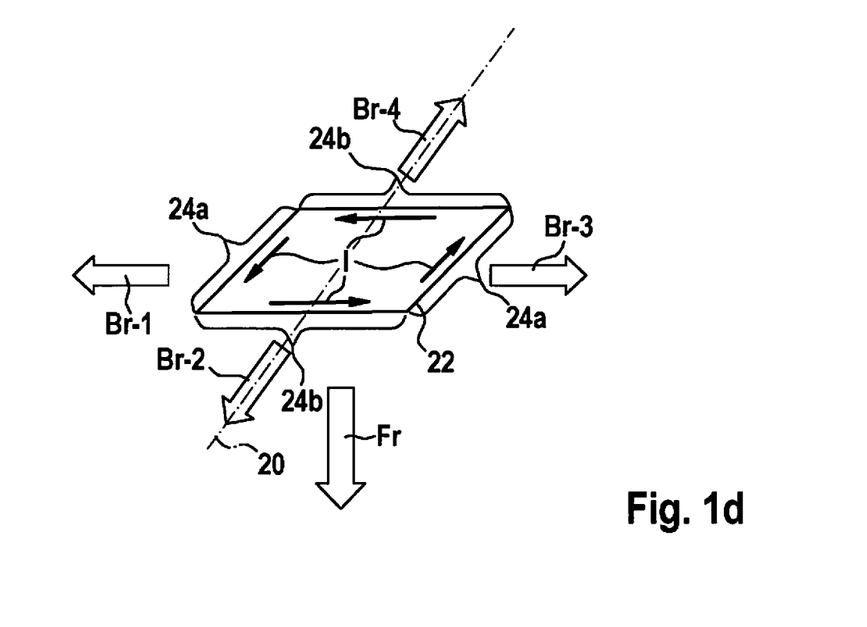

The force Fr is determined from a circumference U of conductive loop 22, the magnetic field components Br-1 to Br-4, and the current strength I, in accordance with equation (Eq. 2):

$$F_r = U*I*B_r \qquad \text{(Eq. 2)}$$

The excitation of permanent magnets 16a and 16b to perform oppositely directed translational motions by way of the force Fr triggers a second displacement motion 28a of displaceable element 10 around a second rotation axis 28, oriented tiltedly with respect to first rotation axis 20, with reference to mount 14 (see FIG. 1c). If it is assumed that a magnetic field 18 having magnetic field components Br-1 to Br-4 of a few mT (millitesla) can be achieved, what is obtained according to equation (Eq. 2) for the force Fr is then approximately 1 mN (millinewton). This force is sufficient to excite the second displacement motion 28a of displaceable element 10.

Because it is equipped with permanent magnets 16a and 16b and with the interacting magnetic device, the micromechanical constituent thus possesses an actuator device with which, with reference to mount 14, not only first displacement motion 20a around first rotation axis 20, but also second displacement motion 28a around second rotation axis 28 oriented tiltedly with respect to first rotation axis 20, are impartable to displaceable element 10. With the micromechanical constituent of FIGS. 1-1e, it is thus possible to dispense with the configuration of a separate drive unit for displacing displaceable element 10 around second rotation axis 28 (in addition to the drive unit used to displace displaceable element 10 around first rotation axis 20). In particular, there is no need to configure an electrostatic drive for the micromechanical constituent of FIGS. 1a-1e. The micromechanical constituent therefore also does not require any drive electrodes.

Second rotation axis 28 of displaceable element 10 can, in particular, be oriented perpendicularly to first rotation axis 20. In particular, first rotation axis 20 and second rotation axis 28 can lie in one shared plane of the micromechanical constituent, and torsion axes 26a and 26b can be oriented perpendicularly to that plane.

Preferably the micromechanical constituent is designed so that second displacement motion 28a of displaceable element 10 is executed as a harmonic or resonant oscillation of displaceable element 10 around second rotation axis 28 at a resonant frequency. This is achievable in that the at least one first permanent magnet 16a is excited at the resonant frequency (because of its magnetic interaction with magnetic field 18) to perform the first translational motion, and the at least one second permanent magnet 16b is excited at the resonant frequency (because of its magnetic interaction with magnetic field 18) to perform the second translational motion. A variation over time of magnetic field components Fr-1 to Fr-4 used to excite the oppositely directed translational motions of permanent magnets 16a and 16b is achievable by way of a suitable design of the magnetic device.

The harmonic or resonant oscillation of displaceable element 10 (with reference to mount 14) around second rotation axis 28, implemented as second displacement motion 28a, produces large deflections of displaceable element 10 out of its neutral position, simultaneously with rapid displaceability thereof. Conversely, displaceable element 10 can be displaced in quasi-steady-state fashion around first rotation axis 20. The micromechanical constituent is thus advantageously suitable for scanning a surface by way of quasi-steady-state displacement of displaceable element 10 around first rotation axis 20, and simultaneous harmonic or resonant displacement of displaceable element 10 around second rotation axis 28. The micromechanical constituent is thus also advantageously usable in a projector (laser projector) or in a headlight (laser headlight) for a vehicle or motor vehicle.

By way of example, in the embodiment of FIGS. 1a-1e, a respective pair of two magnets, constituting the at least one first or second permanent magnet 16a or 16b, is fastened onto first spring element 12a and onto second spring element 12b. Preferably the two magnets of a pair are located on two oppositely located surfaces of the associated spring element 12a and 12b. Permanent magnets 16a and 16b can (all) have a common polarity (perpendicular to first rotation axis 20 and perpendicular to second rotation axis 28). Likewise, the at least one first permanent magnet 16a can have a first polarity (perpendicular to first rotation axis 20 and perpendicular to second rotation axis 28), while the at least one second permanent magnet 16b is oriented with a second polarity directed oppositely to the first polarity. As explained below in further detail, in both cases the desired rotational motions and translational motions of permanent magnets 16a or 16b are excitable. A symmetry of permanent magnets 16a or 16b is furthermore not necessary.

First spring element 12a and second spring element 12b can each be torsion springs 12a and 12b extending along first rotation axis 20. Easily configurable spring types can thus be used for first spring element 12a and second spring element 12b. As shown schematically in FIG. 1e, spring elements 12a and 12b can also encompass at least one lower portion 34a and 34b (having permanent magnets 16a or 16b) having greater rigidity, and at least one lower portion 36a and 36b having less rigidity. A range of embodiments of spring elements 12a and 12b is not limited, however, to a specific spring type. For example, rigidity of the at least one lower portion 34a and 34b having the at least one first or second permanent magnet 16a or 16b is not necessary. An optimization of the overall system is created due to the "separation," created by spring elements 12a and 12b, of the inertia of displaceable element 10 from the inertia of permanent magnets 16a and 16b, by which a large rotational motion of displaceable element 10 is producible by even short excursions of permanent magnets 16a and 16b.

In the embodiment of FIGS. 1a-1e, the micromechanical constituent also encompasses an intermediate frame component 30. Intermediate frame component 30 is connected to mount 14 via first spring element 12 (extending along first rotation axis 20) and via second spring element 12b (extending along first rotation axis 20). By way of example, intermediate frame component 30 is suspended on mount 14 between first spring element 12a and second spring element 12b. First displacement motion 20a around first rotation axis 20, with reference to mount 14, is furthermore impartable to intermediate frame component 30 together with displaceable element 10. Because first displacement motion 20a around first rotation axis 20 is preferably a quasi-steady-state displacement motion, the increased mass resulting from intermediate frame component 30, which is moved in that context around rotation axis 20, is of no substantial importance.

The micromechanical constituent of FIGS. 1a and 1b furthermore also encompasses at least one third spring element 32a and 32b by way of which displaceable element 10 is connected to intermediate frame component 30. Equipping the micromechanical constituent with the at least one third spring element 32a and 32b makes possible a displacement of displaceable element 10 around second rotation axis 28 by flexure of the at least one third spring element 32a and 32b. Displaceable element 10 to which second displacement motion 28a has been imparted is therefore displaceable around rotation axis 28 not only with reference to mount 14 but also with reference to intermediate frame component 30. The resonant frequency of the harmonic oscillation of displaceable element 10 (accompanied by a deformation of the at least one third spring element 32a and 32b) with reference to intermediate frame component 30 around second rotation axis 28 can thus be adjusted, by way of the configuration of the at least one third spring element 32a and 32b, independently of spring characteristics of first spring element 12a and second spring element 12b.

Because of the possibility of omitting drive combs on displaceable element 10, the latter can have an inertia T of approximately $10^{-13}$ kgm$^{-2}$. A resonant frequency (natural frequency) of adjustable element 10 around second rotation axis 28 is calculated according to equation (Eq. 3) as:

$$2\pi f = \sqrt{(k/T)} \tag{Eq. 3}$$

where k is a torsional spring stiffness of the at least one third spring element 32a and 32b. Because of the low moments of inertia with reference to both axes, the micromechanical constituent described here can thus easily be varied within wide limits simply by varying the spring stiffness values. The quasi-steady-state displacement frequency for first displacement motion 20a of displaceable element 10 around first rotation axis 20 can thus be varied from 50 Hz (hertz) to, e.g., 500 Hz (hertz) (since the natural frequency can be set to more than 1 kHz (kilohertz) to, e.g., 2 kHz (kilohertz) with acceptable power consumption), and at the same time, independently thereof, the resonant displacement frequency for second displacement motion 28a of displaceable element 10 around second rotation axis 28 can vary from 3 kHz (kilohertz) to 30 kHz (kilohertz). (Because the moment of inertia of the magnets is not critical, the frequency of displaceable element 10 involves only displaceable element 10 and the at least one spring.) The ability to displace displaceable element 10, for example micromirror 10, around two axes with such a bandwidth in quasi-steady-state and resonant fashion is a substantial advantage of the assemblage described here.

For instance, displaceable element 10 can be connected to intermediate frame component 30 via a third spring element 32a and a fourth spring element 32b, displaceable element 10 being suspended on intermediate frame component 30 between third spring element 32a (extending along second rotation axis 28) and fourth spring element 32b (extending along second rotation axis 28). Easily configurable torsional springs can thus be used for third spring element 32a and fourth spring element 32b as well. A range of embodiments of spring elements 32a and 32b is, however, again not limited to a specific spring type.

Figure 1E:
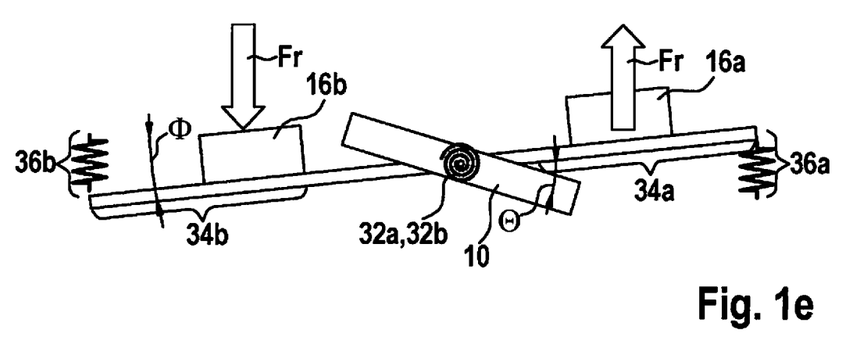

The micromechanical constituent embodied with intermediate frame component 30 can be referred to as a "two spring-mass system," displaceable element 10 and the at least one third spring element 32a and 32b representing a first spring-mass system, and permanent magnets 16a and 16b along with first spring element 12a and second spring element 12b representing a second spring-mass system. The two spring-mass system (with angles θ and Φ shown in FIG. 1e) is described by equations (Eq. 4) and (Eq. 5) as follows:

$$\ddot{\theta} = -\frac{d_m * \theta}{T_m} - \frac{k_m * \theta}{T_m} + \frac{k_m}{T_m} * \Phi \quad \text{(Eq. 4)}$$

$$\ddot{\phi} = -\frac{d_v * \Phi}{T_v} - \frac{k_m * \theta}{T_v} - \frac{(k_v + k_m)}{T_v} * \phi + \frac{F * l_v}{T_v}, \quad \text{(Eq. 5)}$$

where $T_v$ is a moment of inertia of permanent magnets 16a and 16b, $T_m$ a moment of inertia of displaceable element 10, $d_v$ a damping of a motion of permanent magnets 16a and 16b, $d_m$ a damping of a motion of displaceable element 10, $k_v$ a flexural rigidity of spring elements 12a and 12b, $k_m$ a flexural rigidity of spring elements 32a and 32b, $l_v$ a distance between permanent magnets 16a and 16b, and F a force exerted perpendicularly onto permanent magnets 16a and 16b.

Figure 2:
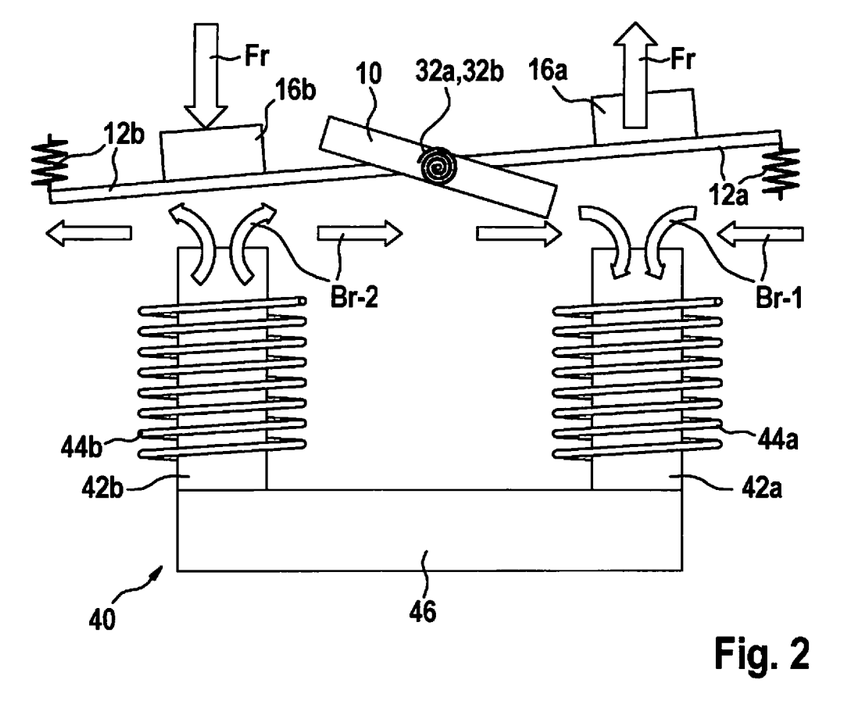
FIG. 2 schematically depicts a second example embodiment of the micromechanical constituent.

FIG. 2 schematically depicts a second embodiment of the micromechanical constituent. The micromechanical constituent of FIG. 2 encompasses the components, already described above, of the preceding embodiment. In the embodiment depicted, permanent magnets 16a and 16b (all) have a common polarity perpendicular to first rotation axis 20 (and perpendicular to second rotation axis 28).

Also depicted in FIG. 2 is an electromagnet 40 used as a magnetic device. Electromagnet 40 encompasses two coils 44a and 44b each wound around a magnet core 42a and 42b. Magnetic field 18 can be generated at permanent magnets 16a and 16b by counter-phase energization of the two coils 44a and 44b with a harmonically oscillating current signal. Magnetic field 18 producible by way of electromagnet 40 can have radial magnetic field components Br-1 to Br-4, for example, at the at least one first permanent magnet 16a and at the at least one second permanent magnet 16b, with the result that the advantageous "seesaw" motions of permanent magnets 16a and 16b can be produced. Magnetic field 18 generated by way of the electromagnets can also be described as "fountain-shaped" at those end surfaces of magnet cores 42a and 42b, which are oriented toward permanent magnets 16a and 16b. As a result of the counter-phase energization of the two coils 44a and 44b with the harmonically oscillating current signal, magnetic field components Br-1 oriented radially with respect to the at least one first permanent magnet 16a are oriented oppositely to magnetic field components Br-2 oriented radially with respect to the at least one second permanent magnet 16b. The forces Fr produced (for a common polarity of permanent magnets 16a and 16b) on permanent magnets 16a and 16b are thus likewise oppositely directed, with the result that excitation of permanent magnets 16a and 16b to perform the oppositely directed translational motions is achieved. Displaceable element 10 is thereby displaceable with reference to mount 14 around second rotation axis 28. Especially if the harmonically oscillating current signal used to energize electromagnet 40 fluctuates at the resonant frequency (of second displacement motion 28a of displaceable element 10 around second rotation axis 28), the "seesaw" motion of permanent magnets 16a and 16b contributes to reliable excitation of the harmonic oscillation of displaceable element 10 around second rotation axis 28.

Magnet cores 42a and 42b of electromagnet 40 can be connected to each other via a yoke 46. Field lines of magnetic field 18 along a circular path extending partly through yoke 46 can be intensified by way of the yoke. In other embodiments, however, it can also be advantageous to use two separate magnet cores 42a and 42b (without yoke 46), since in this case the individual sub-fields of the magnetic field are symmetrical.

Figure 3:
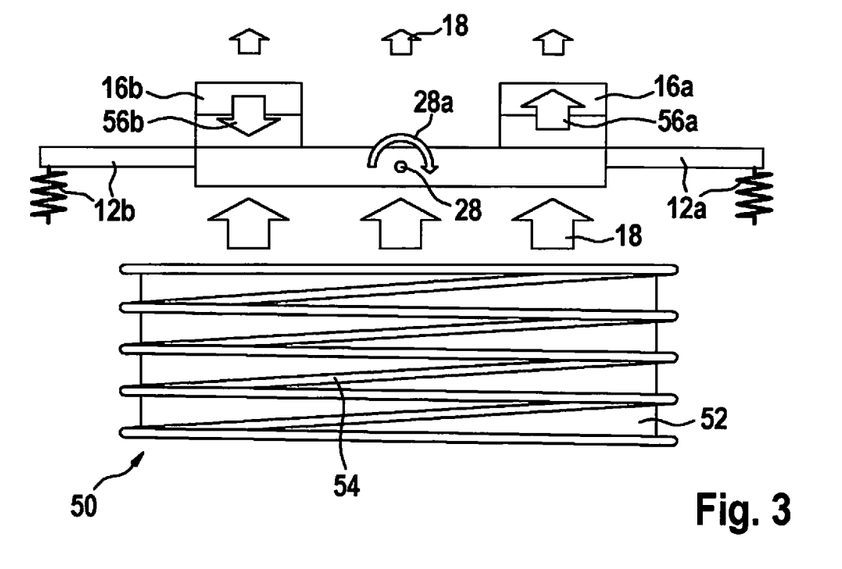
FIG. 3 schematically depicts a third example embodiment of the micromechanical constituent.

FIG. 3 schematically depicts a third example embodiment of the micromechanical constituent. In the embodiment of FIG. 3, electromagnet 50 encompasses only one coil 54 wound around a magnet core 52. By way of a magnetic device of this kind, it is possible to produce a strong magnetic field on a side of permanent magnets 16a and 16b, or of displaceable element 10, oriented toward the coil, and an appreciably weaker magnetic field on a side of permanent magnets 16a and 16b, or of displaceable element 10, directed away from coil 54. Another way to describe this is that magnetic field 18 producible by way of the magnetic device has, both at the at least one first permanent magnet 16a and at the at least one second permanent magnet 16b, a field strength gradient oriented perpendicularly to first rotation axis 20 (and perpendicularly to second rotation axis 28). This inhomogeneity of magnetic field 18 can also produce the oppositely directed forces Fr. Because permanent magnets 16a and 16b have different polarities, the field of a (large) coil 54 already produces the oppositely directed forces Fr on permanent magnets 16a and 16b.

The at least one first permanent magnet 16a of the micromechanical constituent of FIG. 3 has a first polarity 56a oriented perpendicularly to first rotation axis 20 (and perpendicularly to second rotation axis 28), while the at least one second permanent magnet 16b has a second polarity 56b directly oppositely to first polarity 56a. Because of the different polarities 56a and 56b of permanent magnets 16a and 16b, the field strength gradient oriented perpendicularly to first rotation axis 20 (and perpendicularly to second rotation axis 28) produces the desired excitation of the oppositely directed translational motions of permanent magnets 16a and 16b along translation axes 26a and 26b. Displaceable element 10 is thereby displaceable around second rotation axis 28 with reference to mount 14. A harmonically oscillating current signal having the resonant frequency (of second displacement motion 28a of displaceable element 10 around second rotation axis 28) can also be used to energize coil 54, with the result that the "seesaw" motion of permanent magnets 16a and 16b results in reliable excitation of the harmonic oscillation of displaceable element 10 around second rotation axis 28. (In addition, magnetic field 18 producible by way of the magnetic device can also have, at the at least one first permanent magnet 16a and at the at least one second permanent magnet 16b, magnetic field component Bs oriented perpendicularly to first rotation axis 20, with which the advantageous rotational motions of permanent magnets 16a and 16b around first rotation axis 20 can be produced.)

Figure 4:
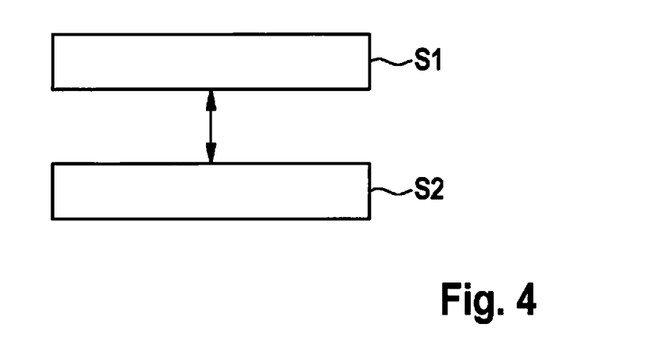
FIG. 4 is a flowchart that illustrates a method for displacing a displaceable element according to an example embodiment of the present invention.

FIG. 4 is a flowchart that illustrates an example method for displacing a displaceable element according to an example embodiment of the present invention. The described method can be executed, for example, by way of the micromechanical constituents explained above. Utilization of such a micromechanical constituent is not, however, a prerequisite for implementability of the method. The method can instead be carried out using a plurality of displaceable elements that are each suspended on a mount at least by way of a first spring element and a second spring element.

In a method step S1, a magnetic field is generated respectively at at least one first permanent magnet disposed on the first spring element and at least one second permanent magnet disposed on the second spring element, in such a way that because of a magnetic interaction with the magnetic field, a first rotational motion around a first rotation axis is imparted to the first permanent magnet, and a second rotational motion around the first rotation axis is imparted to the at least second permanent magnet. A first displacement motion of the displaceable element around the first rotation axis is thereby produced.

A method step S2 is also executed simultaneously with method step S1. In method step S2, by generation of the magnetic field respectively at the at least one first permanent magnet and at the at least one second permanent magnet, additionally the at least one first permanent magnet is excited (because of the magnetic interaction with the magnetic field) to perform a first translational motion tiltedly with respect to the first rotation axis and tiltedly with respect to a second rotation axis oriented tiltedly with respect to the first rotation axis, and the at least one second permanent magnet is excited (because of the magnetic interaction with the magnetic field) to perform a second translational motion directed oppositely to the first translational motion. A second displacement motion of the displaceable element around the second rotation axis is thereby produced. In particular, the magnetic field can be generated respectively at the at least one first permanent magnet and at the at least one second permanent magnet in such a way that (because of the magnetic interaction with the magnetic field) the at least one first permanent magnet is excited to perform the first translational motion at a frequency equal to a resonant frequency of the second displacement motion of the displaceable element around the second rotation axis, and the at least one second permanent magnet is excited to perform the second translational motion at the resonant frequency. A harmonic oscillation of the displaceable element around the second rotation axis at the resonant frequency is thus produced as the second displacement motion of the displaceable element.

What is claimed is:

1. A micromechanical constituent, comprising:
a mount;
a first spring element;
a second spring element;
a displaceable element suspended from the mount via the first and second spring elements; and
an actuator configured to impart to the displaceable element, with reference to the mount, a first displacement motion around a first rotation axis and a second displacement motion around a second rotation axis;
wherein:
one of the first and second rotation axes runs within a plane defined by the mount and the other of the first and second rotation axes is tilted relative to the plane; and
the actuator includes:
at least one first permanent magnet disposed on the first spring element;
at least one second permanent magnet disposed on the second spring element; and
a magnetic field generator configured to produce, at the at least one first permanent magnet and at the at least one second permanent magnet, a magnetic field that, due to magnetic interactions with the magnetic field:
imparts a first rotational motion around the first rotation axis to the at least one first permanent magnet and a second rotational motion around the first rotation axis to the at least one second permanent magnet, thereby causing the first displacement motion of the displaceable element around the first rotation axis; and
excites the at least one first permanent magnet to perform a first translational motion tiltedly with respect to the first rotation axis and tiltedly with respect to the second rotation axis, and excites the at least one second permanent magnet to perform a second translational motion directed oppositely to the first translational motion, thereby causing the second displacement motion of the displaceable element around the second rotation axis, and
wherein a resulting torque M is obtained in accordance with $M=I*B*l*b$, where l is a length of the at least one first or second permanent magnet along the first rotation axis, and b is a width of the at least one first or second permanent magnet perpendicularly to the first rotation axis, so that the resulting torque is sufficient for rotating the at least one first or second permanent magnet with a magnetic field having a magnetic field strength of at most 10 milliTesla (mT), and wherein the length is greater than the width, and
wherein in-phase or mirror-symmetrical rotational motions of the permanent magnets produce a uniform displacement of the displaceable element around the first rotation axis.

2. The micromechanical constituent of claim 1, wherein:
the second displacement motion of the displaceable element is a harmonic oscillation of the displaceable element around the second rotation axis at a resonant frequency, and
because of the magnetic interactions with the magnetic field, the at least one first permanent magnet is excitable to perform the first translational motion at the resonant frequency and the at least one second permanent magnet is excitable to perform the second translational motion at the resonant frequency.

3. The micromechanical constituent of claim 1, wherein the first rotational motion of the at least one first permanent magnet around the first rotation axis is in phase with the second rotational motion of the at least one second permanent magnet around the first rotation axis.

4. The micromechanical constituent of claim 1, wherein the magnetic field includes at each of the at least one first permanent magnet and the at least one second permanent magnet a magnetic field component oriented perpendicularly to the first rotation axis.

5. The micromechanical constituent of claim 4, wherein the magnetic field includes radial magnetic field components at the at least one first permanent magnet and includes radial magnetic field components at the at least one second permanent magnet.

6. The micromechanical constituent of claim 5, wherein the magnetic field generator is designed to modulate the magnetic field components oriented perpendicularly to the first rotation axis at least one first frequency, and the radial magnetic field components at at least one second frequency not equal to the first frequency.

7. The micromechanical constituent of claim 4, wherein:
the at least one first permanent magnet has a first polarity oriented perpendicularly to the first rotation axis,
the at least one second permanent magnet has a second polarity directed oppositely to the first polarity, and
the magnetic field has, both at the at least one first permanent magnet and at the at least one second permanent magnet, a field strength gradient oriented perpendicularly to the first rotation axis.

8. The micromechanical constituent of claim 1, further comprising:
an intermediate frame component that is (a) connected to the mount via the first spring element extending along the first rotation axis and via the second spring element extending along the first rotation axis, and (b) suspended from the mount between the first spring element and the second spring element, wherein the first displacement motion around the first rotation axis with reference to the mount is impartable to the intermediate frame component together with the displaceable element; and
at least one third spring element via which the displaceable element is connected to the intermediate frame component in such a way that the second displacement motion around the second rotation axis, with reference to the intermediate frame component and the mount, is impartable to the displaceable element.

9. The micromechanical constituent of claim 1, wherein the displaceable element is a micromirror.

10. A method for displacing a displaceable element that is suspended from a mount via at least a first spring element and a second spring element, the method comprising:
generating a magnetic field at at least one first permanent magnet that is on the first spring element and at least one second permanent magnet that is on the second spring element, wherein, due to a magnetic interaction with the magnetic field:
a first rotational motion around a first rotation axis is imparted to the first permanent magnet and a second rotational motion around the first rotation axis is imparted to the at least second permanent magnet, thereby producing a first displacement motion of the displaceable element around the first rotation axis, and
the at least one first permanent magnet is excited to perform a first translational motion tiltedly with respect to the first rotation axis and tiltedly with respect to a second rotation axis, and the at least one second permanent magnet is excited to perform a second translational motion directed oppositely to the first translational motion, thereby producing a second displacement motion of the displaceable element around the second rotation axis, wherein one of the first and second rotation axes runs in line with a plane defined by the mount and the other of the first and second rotation axes is oriented tiltedly with respect to the plane, and
wherein a resulting torque M is obtained in accordance with $M=I*B*l*b$, where l is a length of the at least one first or second permanent magnet along the first rotation axis, and b is a width of the at least one first or second permanent magnet perpendicularly to the first rotation axis, so that the resulting torque is sufficient for rotating the at least one first or second permanent magnet with a magnetic field having a magnetic field strength of at most 10 milliTesla (mT), and wherein the length is greater than the width, and
wherein in-phase or mirror-symmetrical rotational motions of the permanent magnets produce a uniform displacement of the displaceable element around the first rotation axis.

11. The method of claim 10, wherein, due to the magnetic interaction with the magnetic field, the at least one first permanent magnet is excited to perform the first translational motion at a frequency equal to a resonant frequency of the second displacement motion of the displaceable element around the second rotation, and the at least one second permanent magnet is excited to perform the second translational motion at the resonant frequency, thereby producing a harmonic oscillation of the displaceable element around the second rotation axis at the resonant frequency as the second displacement motion of the displaceable element.

* * * * *